(12) United States Patent
Koh

(10) Patent No.: US 6,627,378 B1
(45) Date of Patent: Sep. 30, 2003

(54) PHOTORESIST COMPOSITION FOR TOP-SURFACE IMAGING PROCESS BY SILYLATION

(75) Inventor: Cha Won Koh, Kyoungki-do (KR)

(73) Assignee: Hyundai Electronics Industries Co., Ltd (KR)

( * ) Notice: Subject to any disclaimer, the term of this patent is extended or adjusted under 35 U.S.C. 154(b) by 0 days.

(21) Appl. No.: 09/710,434

(22) Filed: Nov. 10, 2000

(30) Foreign Application Priority Data

Nov. 12, 1999 (KR) .............................. 99-50093

(51) Int. Cl.[7] .......................... G03F 7/00; G03F 7/004; G03F 7/38; G03F 7/40
(52) U.S. Cl. .................... 430/270.1; 430/311; 430/314; 430/322; 430/323; 430/330; 430/325
(58) Field of Search .............................. 430/270.1, 311, 430/314, 322, 323, 330, 325

(56) References Cited

U.S. PATENT DOCUMENTS

| | | | |
|---|---|---|---|
| 5,427,649 A | * | 6/1995 | Kim et al. ............. 156/661.11 |
| 5,487,967 A | * | 1/1996 | Hutton et al. ................ 430/322 |
| 5,491,047 A | * | 2/1996 | Kim et al. ................... 430/329 |
| 5,627,006 A | * | 5/1997 | Urano et al. ................. 430/192 |
| 5,759,748 A | * | 6/1998 | Chun et al. .................. 430/323 |
| 6,083,658 A | * | 7/2000 | Kunita et al. ............. 430/270.1 |
| 6,103,445 A | * | 8/2000 | Willson et al. ........... 430/270.1 |
| 6,403,281 B1 | * | 6/2002 | Lee et al. ................. 430/270.1 |

* cited by examiner

Primary Examiner—Janet Baxter
Assistant Examiner—Amanda C. Walke
(74) Attorney, Agent, or Firm—Townsend and Townsend and Crew LLP

(57) ABSTRACT

The present invention provides photoresist compositions for a Top-surface Imaging Process by Silylation (TIPS) and processes for using the same. The photoresist composition comprising a photoresist resin, a photoacid generator, an organic compound, and an amphoteric compound. The amphoteric compound prevents or reduces the amount of acid diffusion into the unexposed area and improves the contrast between the exposed and the unexposed areas. This reduction or prevention of acid diffusion into the unexposed areas reduces line edge roughness (LER).

21 Claims, 5 Drawing Sheets

PHOTORESIST COMPOSITION FOR TOP-SURFACE IMAGING PROCESS BY SILYLATION

BACKGROUND OF THE INVENTION

1. Field of the Invention

The present invention relates to a photoresist composition comprising an amphoteric compound and a method for using the same. In particular, the present invention relates to a photoresist composition which is useful in a Top-surface Imaging Process by Silylation ("TIPS") and a process for using the same.

2. Description of the Background Art

Thin layer imaging technologies such as TIPS are effective patterning processes for photolithography using a wavelength below 193 nm and optical lithography using an extreme ultraviolet (EUV) wavelength (e.g., 13 nm).

Some of the known limitations of the photolithography include substrate's influence on the light (e.g., reflection, scattering, defraction, etc.), notching, standing wave effect, pattern collapse, non-uniformity of a critical dimension (CD), isolated and grouped bias (IG bias) and the like. In TIPS, a shallow exposure is performed which forms a latent image by diffusion of acids that is generated in the exposed region. The exposed region is then selectively silylated with a silylating agent. The silylated region serves as a mask, and the non-silylated region is dry-etched by $O_2$ plasma (see FIG. 1). Thus, TIPS requires photoresist compositions having a high energy absorption coefficient and process conditions that have high selectivity in etching non-silylated regions during $O_2$ plasma treatment.

TIPS is rarely influenced by substrates and topology. In addition, TIPS is less sensitive to transparency, adhesiveness and etching selection ratio of the photoresist composition. TIPS also has a much wider depth of focus in high resolution than a single layer resist (SLR). Thus, in some aspects, TIPS has more advantages than a general resist patterning process.

In addition, compared with a wet development of SLR, the dry development process of TIPS can be applied to a thick resist process in a high aspect ratio without causing a pattern to collapse. This advantage is useful on a substrate having a relatively low etching selection ratio, such as an oxide or metal. As a result, TIPS is recognized as an alternative to SLR.

In one particular example of TIPS, Plasmask 305-u (Japanese Synthetic Rubber) photoresist composition is used in KrF lithography. The incident radiation creates silylation sites on the top surface of the photoresist film. The exposed regions are then silylated by contating with a highly reactive gas phase silylation agent (e.g., an amino silane). An etching mask layer of silicon dioxide is then created by an oxygen plasma treatment. A photoresist pattern having a negative tone is then created using a dry development process.

To create a high resolution photoresist pattern requires a short wavelength in lithography process. It is believed that TIPS is well suited for such a high resolution photoresist pattern formation, in particular in a semiconductor device manufacturing process. Generally, however, current TIPS can not be used in a high resolution photoresist pattern formation. For example, in most cases roughness is generated at the edge of the resist pattern after dry development in TIPS, and therefore using a photoresist composition having high photosensitivity is not sufficient to create a useful pohtoresist pattern. Especially, since the line edge roughness ("LER") generated during TIPS is often transferred to the underlying substrate during a pattern transfer step. This disadvantage of LER gets worse when the critical dimension (CD) is below 180 nm. FIG. 2 shows the LER generated using 180 nm wavelength lithography in the conventional SLR process and the TIPS. As shown in FIG. 2, the LER is more pronounced in the TIPS than in the SLR process. In general, the LER becomes more pronounced and more problematic as the pattern resolution increases (i.e., smaller the pattern size). For example, FIG. 3 shows a 120 nm L/S pattern obtained by the ArF TIPS. As is evident from FIG. 3, the LER must be improved significantly in order to be useful in a semiconductor device manufacturing process.

A line width variation resulting from the LER decreases the CD tolerance budget and the process margin. These decreases deteriorate process uniformity and device performance.

LER in the silylated resist pattern formation process is caused by various factors. Without being bound by any theory, it is believed that the LER is mainly due to the breakdown of edges of a silicon dioxide mask during the dry development process. In an ideal process, LER is not generated as depicted in FIG. 4A. However, as illustrated in FIG. 4B, it is believed that the gas phase silylation agent swells into the adjacent area of the exposed portion resulting in silylation of undesired regions and a low surface of the non-exposed section. It is believed that the LER occurs during the dry development process due to breakdown of these silicon dioxide layer that was formed in undesired regions and the unexposed regions in the silylation step.

Some of the significant problems of LER are a low silylation contrast, low silicon content, and silylation angle of the resist. It is believed that the silicon content of the etching mask has a significant affect on the generation of LER. In addition, LER can also occur due to the etching process, etching chemistry, etching selection ratio, mask etching, and etching profile such as sidewall morphology.

SUMMARY OF THE INVENTION

An object of the present invention is to provide a photoresist composition for a top-surface imaging process by silylation (TIPS) which can reduce line edge roughness (LER), and a method for using the same.

Another object of the present invention is to provide a semiconductor element produced by using the TIPS described above.

DETAILED DESCRIPTION OF THE PREFERRED EMBODIMENTS

The present invention provides a photoresist composition for a top-surface imaging process by silylation (TIPS). In one aspect, the photoresist composition of the present invention comprises a photoresist resin (i.e., polymer), a photo-acid generator, an organic solvent, and an amphoteric compound. An "amphoteric compound" is a compound which comprises both an acidic group and a basic group. Preferably, the amphoteric compound of the present invention comprises an amino group and a carboxylic acid group. More preferably, the amphoteric compound is an amino acid. Still more preferably, the amphoteric compound is a naturally occurring amino acid. And most preferably, the amphoteric compound is selected from the group consisting of Gly, Ala, Val, Leu, Ile, Met, Pro, Phe, Trp, Ser, Thr, Cys, Tyr, Asn and Gln.

The amount of amphoteric compound in the photoresist composition is typically from about 5 to about 300 mol % of the photoacid generator employed.

Figure 1:
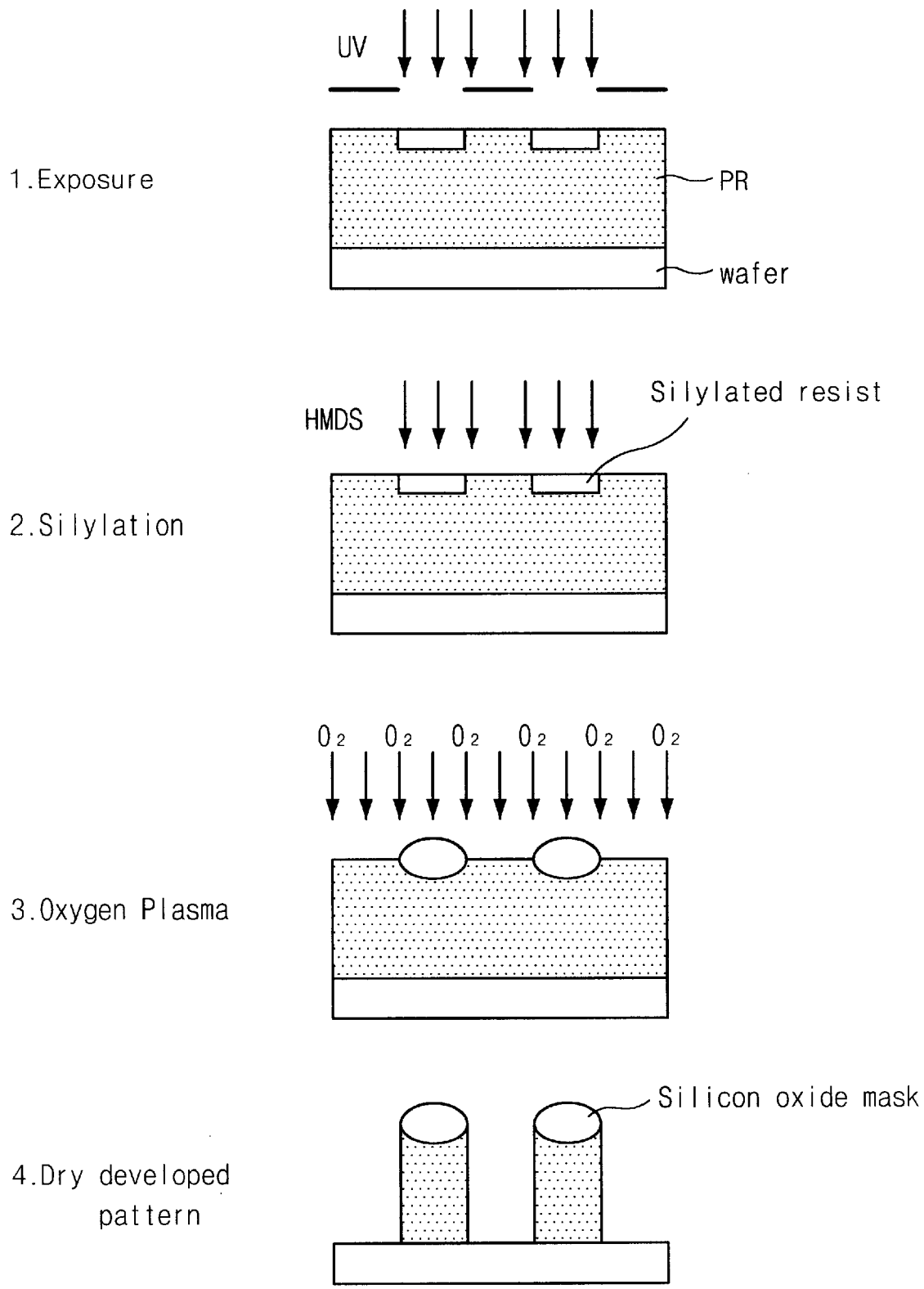
FIG. 1 is a schematic view illustrating TIPS in accordance with the present invention.
Figure 2:
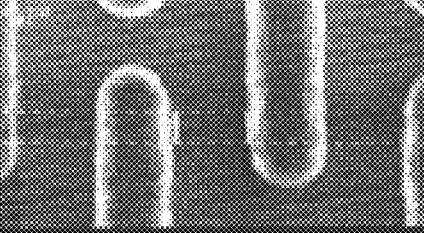
FIG. 2 shows LER generated in both SLR process and TIPS.
Figure 3:
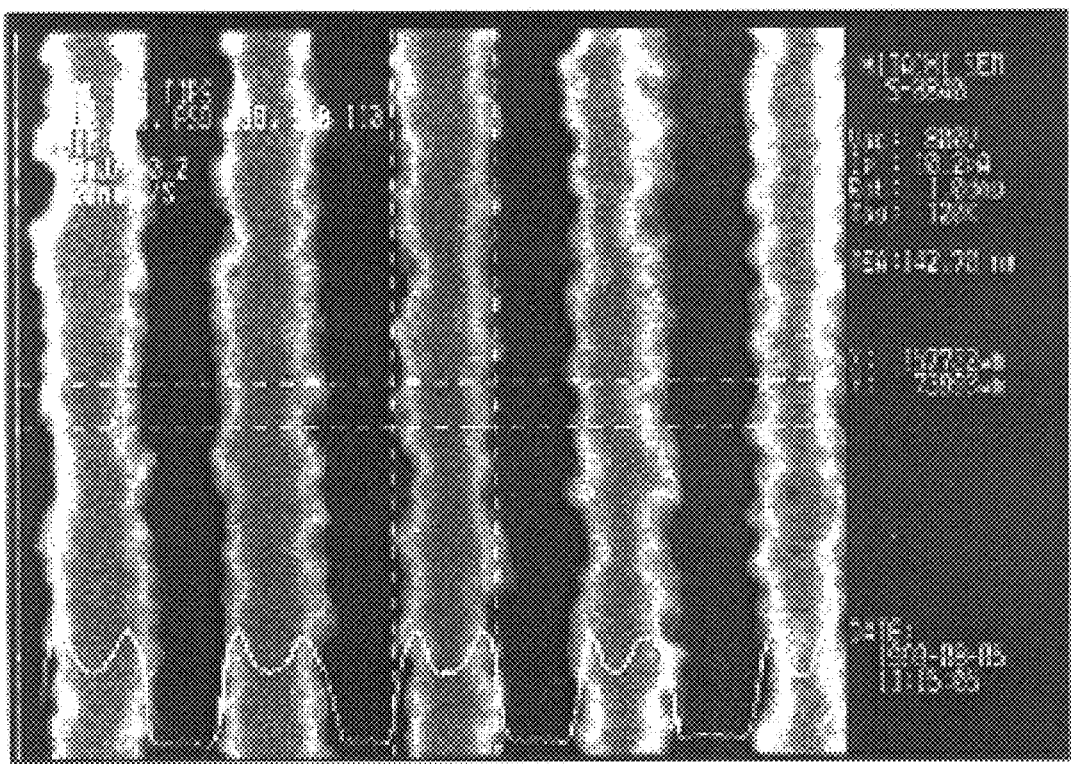
FIG. 3 shows a 120 nm L/S pattern formed by general ArF TIPS.
Figure 4:
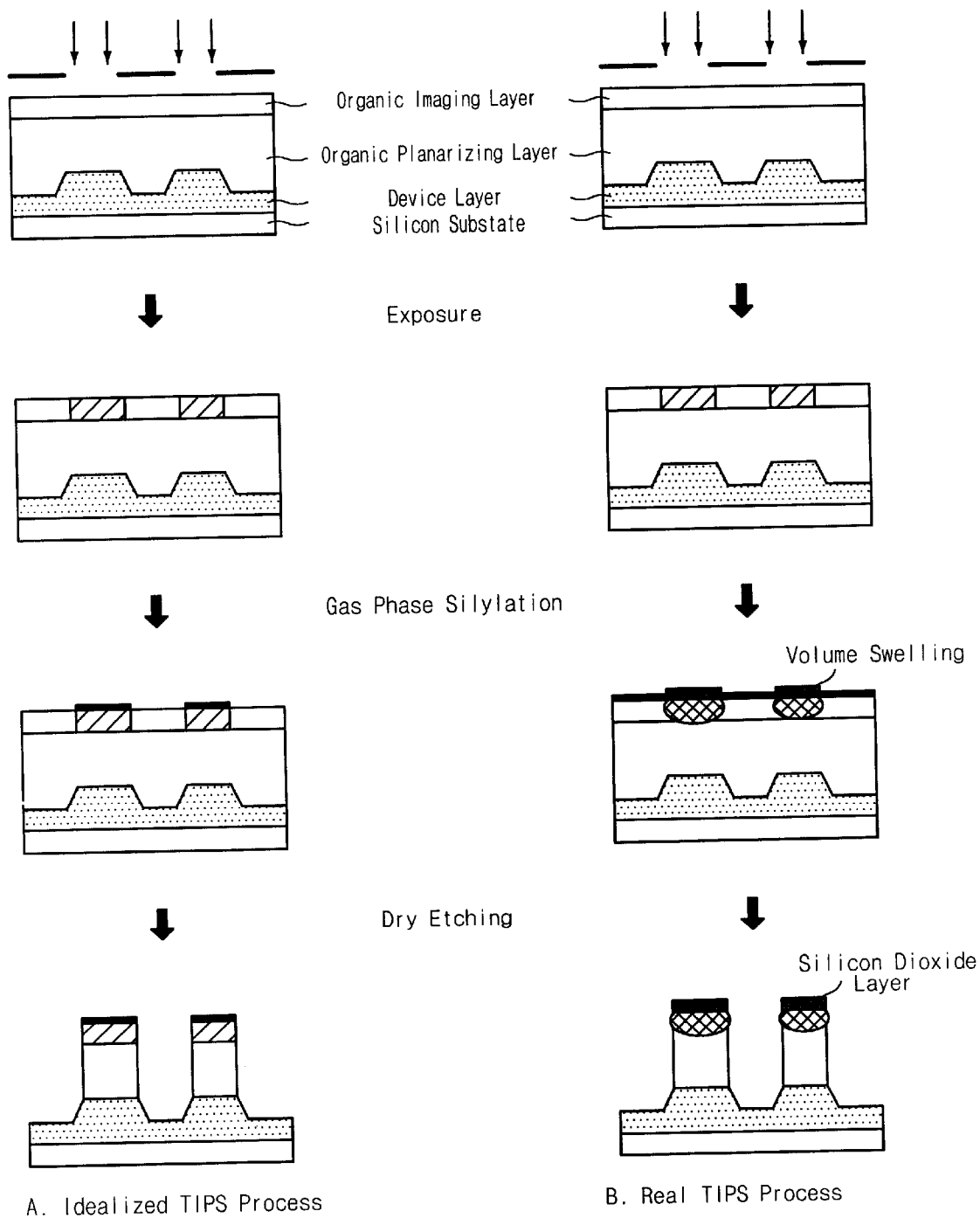
FIGS. 4A and 4B show an ideal TIPS and an actual TIPS, respectively.
Figure 5:
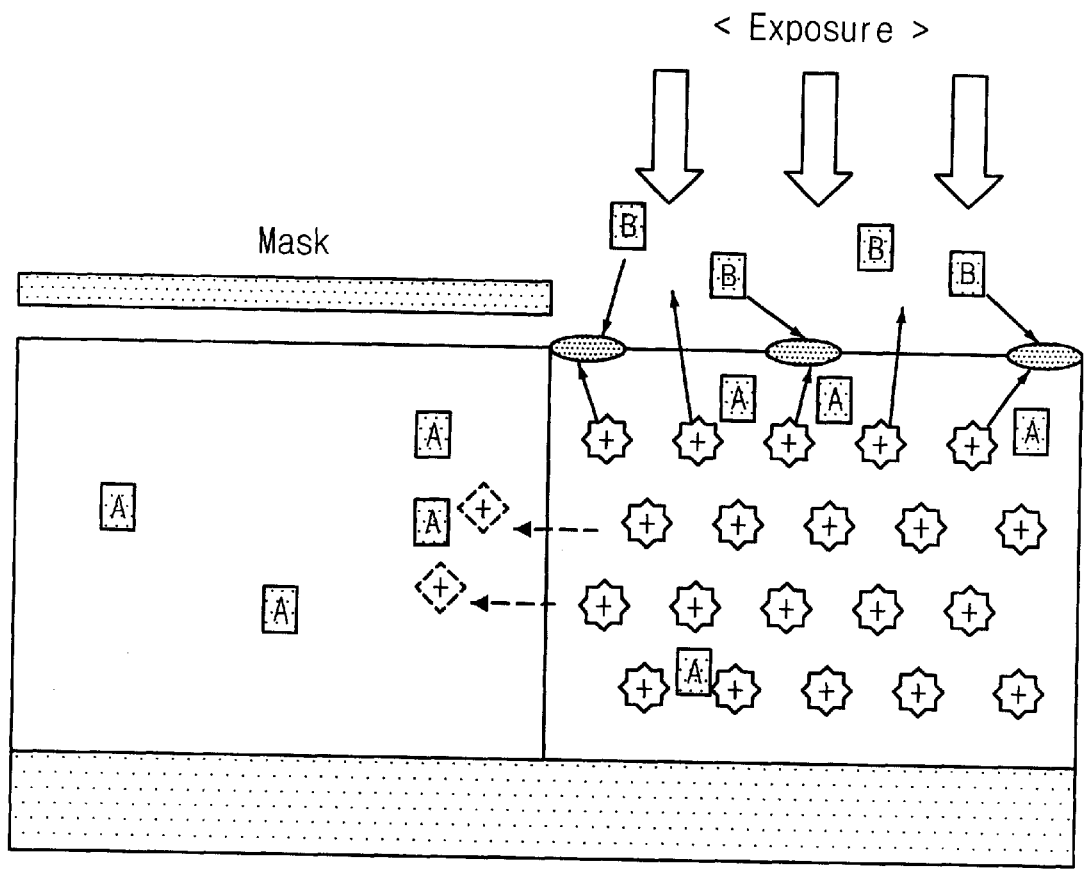
FIG. 5 is a cross-sectional view illustrating an improved contrast between the exposed and non-exposed area by amino acids (A: amphoteric compound, B: environmental amine).

Without being bound by any theory, it is believed that the basic moiety of amphoteric compound prevents or reduces the amount acid that is generated during a photolithography process from diffusing into the unexposed area by quenching (i.e., neutralizing) the acid. It is believed that this prevention of acid from diffusing into the unexposed area improves a contrast between the exposed and the unexposed areas, thereby preventing the silylation or reducing the amount of silylation occurring at the unexposed area (see FIG. 5). As a result, the amphoteric compound significantly reduces line edge roughness (LER). In addition, it is believed that the amphoteric compound also prevents acids that are generated by a photolithography process from reacting with ambient amines (i.e., amines which are present in the atmosphere).

Preferably, relative to a photoresist composition in the absence of the amphoteric compound, the photoresist composition of the present invention reduces LER by at least about 10% at the wavelength of 248 nm and 193 nm.

Any suitable photoacid generators currently known to one skilled in the art can be used in the photoresist composition of the present invention. Preferably, however, the photoacid generator is selected from the group consisting of diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluororphosphate, triphenylsulfonium hexafluoroarsenate, triphenylsulfonium hexafluoroantimonate, triphenylsulfonium triflate and dibutylnaphthylsulfonium triflate. The amount of photoacid generator is from about 0.1 to about 10% by weight of the photoresist resin employed.

The photoresist resin can be any chemically amplified photoresist resins currently known to one of ordinary skill in the art. In particular, chemically amplified photoresist resins that can be used in TIPS. Preferred photoresist resins are photoresist polymers comprising a hydroxyl group.

Exemplary organic solvents suitable in PR compositions of the present invention include methyl 3-methoxypropionate, ethyl 3-ethoxypropionate, propylene glycol methyl ether acetate and cyclohexanone.

The amount of the photoresist resin in the photoresist composition of the present invention is preferably from about 10 to about 30% by weight of the organic solvent employed.

The present invention also provides a process for forming a photoresist pattern comprising the steps of:

(a) coating a photoresist composition of the present invention on a substrate of a semiconductor element to form a photoresist film;

(b) exposing said photoresist film to light using a light source;

(c) contacting said exposed photoresist film with a silylating agent under conditions sufficient to produce a silylated layer on the exposed surface of said exposed photoresist film;

(d) developing said silylated photoresist film under conditions sufficient to produce a silicon oxide pattern; and (e) etching the substrate using said silicon oxide film pattern as an etching mask.

The substrate is preferably pre-treated with hexamethyldisilazane [HMDS: $(CH_3)_3Si-NH-Si(CH_3)_3$] before step (a). The pre-treatment improves adhesiveness between the substrate and the photoresist composition.

The process for forming the photoresist pattern can further include a baking step before and/or after exposure of step (b). Preferably, the baking step is performed at temperature in the range of from about 70 to about 200° C. The soft baking step before exposure transforms the photoresist composition into a solid-type resist film by evaporating about 80 to about 90% of the solvent in the photoresist composition.

The effects of the post exposure baking step are different in the case of i-line photoresists and deep ultraviolet (DUV) photoresists. In i-line photoresists, the localized concentration of the photosensitizer changes due to interference between incident light and reflected light and results in a standing wave effect. The post exposure baking step causes diffusion of the photosensitizer and decreases a standing wave effect.

In the case of DUV photoresists, the post exposure baking step causes a difference in solubility due to a chemical reaction which takes place between the photoresist resin and acids ($H^+$) generated by exposure.

Exemplary light sources which are useful for forming the PR pattern include g-line, i-line, ArF, KrF, VUV, EUV, E-beam, X-ray and ion beam. The irradiation energy is preferably in the range of from about 0.1 to about 10 mJ/cm$^2$.

The silylation agent for the silylation process is preferably selected from the group consisting of hexamethyldisilazane (HMDS), tetramethyldisilazane (TMDS) and bis(dimethyl amino)methyl silane [B(DMA)MS]. The silylation agent can be employed in a liquid phase or, preferably, in a gas phase.

In the silylation process, it is believed that the silylating agent diffuses and penetrates into the photoresist resin. The hydroxy group present in the photoresist resin reacts with the silylating agent to form a silicon-oxygen bond. When thermal energy or moisture ($H_2O$) is added, the silylating agent diffuses out easily. Therefore the silylation and dry development processes are preferably performed in a single chamber.

In another embodiment, the present invention provides a semiconductor element that is manufactured using the photoresist composition described above.

The present invention will now be described in more detail by referring to the examples below, which are not intended to be limiting.

EXAMPLE

Preparation of Photoresist Composition and Formation of Pattern

To 40 g of 3-methoxy methylpropionate was added 10 g of poly(maleic anhydride/mono-2-ethyl-2-hydroxymethylbutyl bicyclo[2.2.1] hept-5-ene-2,3- dicarboxylate/ tert-butyl bicyclo[2.2.1] hept-5-ene-2-carboxylate), 0.01 to 1g of triphenylsulfonium triflate or dibutyl naphthylsulfonium triflate, and 0.03 g of proline. The resulting mixture was stirred and filtered through a 0.10μm filter to produce a photoresist composition.

The photoresist composition was spin-coated on a silicon wafer at a thickness of about 9000 Å, soft-baked in an oven or hot plate at 130° C. for 90 seconds. After baking, the photoresist was exposed to light by using Nikon S201-A KrF scanner. The exposed wafer was presilylation-baked at 120° C. for 90 seconds to cross-link the resin. The wafer was then silylated by adding TMDS at 110° C. for 150 seconds. Lam TCP 9400 SE was employed for dry development. The dry development included breakthrough for removing silicon dioxide mask; oxygen plasma etching and over-etching for etching a resist. The dry development was performed under the conditions of 35 sccm $O_2$, 500 W of top power, 100 W of bottom power, 75 W of bias, -30° C. and 5 mtorr. LER and profile of the thusly-formed pattern were evaluated by scanning electron microscopy. Measurement of LER and observation of the line width were achieved using Hitachi 8820 CD-SEM.

As discussed earlier, the photoresist composition of the present invention comprises an amphoteric compound as an additive. It is believed that when acids generated at the exposed area diffuse into the unexposed area during TIPS, the amphoteric compound quenches the acids. This prevention of acid diffusion into the unexposed area improves the contrast between the exposed and the unexposed areas. Therefore, the photoresist composition of the present invention reduces LER generated when the silylated region is broken during the dry development by a small amount of acid diffused into the unexposed area from the exposed area.

What is claimed is:

1. A photoresist composition for a top-surface imaging process by silylation (TIPS), comprising poly(maleic anhydride/mono-2-ethyl-2-hydroxymethylbutyl bicyclo[2.2.1] hept-5-ene-2,3-dicarboxylate/tert-butyl bicyclo[2.2.1] hept-5-ene-2-carboxylate), a photoacid generator, an organic solvent and an amphoteric compound.

2. The photoresist composition of claim 1, wherein said amphoteric compound comprises an amino group and a carboxylic acid group.

3. The photoresist composition of claim 2, wherein said amphoteric compound is an amino acid.

4. The photoresist composition of claim 3, wherein said amino acid is selected from the group consisting of Gly, Ala, Val, Leu, Ile, Met, Pro, Phe, Trp, Ser, Thr, Cys, Tyr, Asn and Gln.

5. The photoresist composition of claim 1, wherein the amount of said amphoteric compound in said composition is in the range of from about 5 to about 300 mol % of said photoacid generator.

6. The photoresist composition of claim 1, wherein said photoacid generator is selected from the group consisting of diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluororphosphate, triphenylsulfonium hexafluoroarsenate, triphenylsulfonium hexafluoroantimonate, triphenylsulfonium triflate, dibutyl-naphthylsulfonium triflate, and mixtures thereof.

7. The photoresist composition of claim 1, wherein the amount of said photoacid generator is from about 0.1 to about 10% by weight of said photoresist resin.

8. The photoresist composition of claim 1, wherein said organic solvent is selected from the group consisting of methyl 3-methoxypropionate, ethyl 3-ethoxypropionate, propylene glycol methyl ether acetate and cyclohexanone.

9. The photoresist composition of claim 1, wherein the amount of said photoresist resin is from about 10 to about 30% by weight of said organic solvent.

10. A process for forming a photoresist pattern comprising the steps of:

(a) coating a photoresist composition of claim 1 on a substrate of a semiconductor element to form a photoresist film;

(b) exposing said photoresist film to light using a light source;

(c) contacting said exposed photoresist film with a silylating agent under conditions sufficient to produce a silylated layer on the exposed surface of said exposed photoresist film;

(d) developing said silylated photoresist film under conditions sufficient to produce a silicon oxide pattern; and (e) etching the substrate using said silicon oxide film pattern as an etching mask.

11. The process of claim 10 further comprising the steps of contacting said substrate with hexamethyldisilazane before said step (a).

12. The process of claim 10 further comprising a baking step before and/or after said light exposure step.

13. The process of claim 12, wherein said baking step comprises heating said photoresist film to temperature in the range of from about 70 to about 200° C.

14. The process of claim 10, wherein said light source is selected from the group consisting of g-line, i-line, ArF, KrF, VUV, EUV, E-beam, X-ray and ion beam.

15. The process of claim 10, wherein said exposure step comprises irradiating said photoresist film with about 0.1 to about 10 mJ/cm$^2$ of light-exposure energy.

16. The process of claim 10, wherein said silylation agent is selected from the group consisting of hexamethyldisilazane, tetramethyldisilazane, and bis(dimethyl amino)methyl silane.

17. A method for reducing line edge roughness of a photoresist pattern in a top-surface imaging process by silylation, wherein said method comprises the steps of:

(a) coating a semiconductor substrate with a photoresist composition of claim 1 to produce a photoresist film; and (b) producing a photoresist pattern on said photoresist film using a top-surface imaging process by silylation.

18. The method of claim 17, wherein said method provides at least about 10% reduction in line edge roughness of a photoresist pattern compared to a photoresist composition lacking said amphoteric compound.

19. The method of claim 17, wherein said amphoteric compound comprises an amino group and a carboxylic acid group.

20. The method of claim 19, wherein said amphoteric compound is an amino acid.

21. The method of claim 20, wherein said amino acid is selected from the group consisting of Gly, Ala, Val, Leu, Ile, Met, Pro, Phe, Trp, Ser, Thr, Cys, Tyr, Asn and Gln.

* * * * *